United States Patent

Schiemann

[11] 3,990,001
[45] Nov. 2, 1976

[54] MEASURING TRANSFORMER FOR INSTALLATION IN THE METAL ENCLOSURE OF A SWITCHING INSTALLATION

[75] Inventor: Heinz Schiemann, Berlin, Germany

[73] Assignee: Siemens Aktiengesellschaft, Munich, Germany

[22] Filed: May 17, 1974

[21] Appl. No.: 471,015

[30] Foreign Application Priority Data
May 17, 1973 Germany............................ 2325441

[52] U.S. Cl. ................................ 323/44 R; 307/147;
336/174; 336/175; 323/93
[51] Int. Cl.² ...................... H01F 27/00; H01B 9/06
[58] Field of Search ............. 307/147, 149; 174/27,
174/28, 99 R, 99 B, DIG. 10; 313/93, 44 R;
336/174, 173, 175

[56] References Cited
UNITED STATES PATENTS

| | | | |
|---|---|---|---|
| 1,873,977 | 8/1932 | Naef | 174/DIG. 10 |
| 2,957,150 | 10/1960 | Jennings et al. | 336/174 |
| 3,082,389 | 3/1963 | Settles et al. | 336/173 X |
| 3,562,460 | 2/1971 | Koerner | 200/148 B |
| 3,652,778 | 3/1972 | Sakai | 174/28 |
| 3,701,944 | 10/1972 | Amalric | 174/11 BH |
| 3,715,532 | 2/1973 | Morva | 174/28 |
| 3,763,378 | 10/1973 | Müller | 323/93 X |
| 3,814,831 | 6/1974 | Olsen | 174/28 |
| 3,829,742 | 8/1974 | Müller | 323/93 X |

*Primary Examiner*—Gerald Goldberg
*Attorney, Agent, or Firm*—Kenyon & Kenyon Reilly Carr & Chapin

[57] ABSTRACT

A measuring transformer for installation in the metal encapsulation of a switching installation is provided with at least one ring-shaped mounting shoulder which is clamped between flanges of the metal encapsulation.

14 Claims, 2 Drawing Figures

MEASURING TRANSFORMER FOR INSTALLATION IN THE METAL ENCLOSURE OF A SWITCHING INSTALLATION

BACKGROUND OF THE INVENTION

The invention relates to a measuring transformer for installation in the metal encapsulation of a switching installation.

From U.S. Pat. No. 3,562,460 it is known to mount an arrangement with movable parts of a switch in a partition of a metal-encapsulated switching installation. However, the known arrangement does not relate to an apparatus need for making measurements within the metal enclosure and incorporates no measuring transformer or parts of measuring transformers.

SUMMARY OF THE INVENTION

It is an object of the invention to provide a measuring transformer which is easy to install in the metal encapsulation of a switching installation without the need for complicated accessories and without a complicated configuration of the measuring transformer.

The above object is realized in the measuring transformer of the invention by providing at least one ring-shaped mounting shoulder which is clamped between flanges of the metal encapsulation.

The primary advantage of the measuring transformer according to the invention is that no connection elements need to be attached inside the metal encapsulation to install the transformer; this is so because the measuring transformer is held inside the metal encapsulation when the flanges of the metal encapsulation are clamped together. Such flanges need not be provided additionally in every case because a switching installation is, as a rule, composed of several individual encapsulation sections so that for installing the measuring transformer according to the invention between two parts of the encapsulation, it is possible to clamp the mounting shoulder of the measuring transformer and so hold the measuring transformer in a metal encapsulation without additional mounting means.

In the measuring transformer according to the invention, the mounting shoulder can be configured in different ways. If the measuring transformer contains an insulator body, then the mounting shoulder is advantageously formed by an extension of the insulator body because it is relatively simple to fasten the shoulder to an insulator body.

If the insulator is a cast body, it appears advantageous for manufacturing reasons to make the mounting shoulder as a cast extension of the casting. However, it is also possible to use a ring-shaped part as the mounting shoulder and to embed this part in the casting.

The invention can be applied advantageously also in a measuring transformer with at least one metal tube for mounting current transformer cores and/or for forming an electrode of a high-potential capacitor of a capacitive divider, if the mounting shoulder is formed by a support disc connected with the tube. If the measuring transformer is only a current transformer, that is, if the metal tube serves only for mounting current transformer cores, the the support disc can consist of metal or plastic; one will advantageously use a metal support disc so that the metal tube is galvanically connected with the metal encapsulation and is grounded, and in addition, a good, gastight seal at the joint is achieved.

If, on the other hand, the metal tube is used to form an electrode of the high-potential capacitor, to obtain a capacitive voltage divider for metal-encapsulated switching installations or to obtain a combined current and capacitive voltage transformer, then the metal tube is advantageously held in the metal encapsulation by means of a support disc of plastic material, in order to arrange the metal tube in insulated relation to the metal encapsulation.

The invention concerns not only current transformers, voltage transformers or combined current and voltage transformers for switching installations with a single high-voltage conductor, but it is applicable also to switching installations carrying several high-voltage conductors. Also in switching installations of the last-mentioned kind, the mounting of the measuring transformer within the metal encapsulation raises problems regarding configurations which are favorable from a manufacturing point of view and are therefore advantageous with respect to production costs and can be solved in an advantageous manner by the application of the invention.

Although the invention is illustrated and described herein as a measuring transformer for installation in the metal enclosure of a switching installation, it is nevertheless not intended to be limited to the details shown, since various modifications may be made therein within the scope and the range of the claims. The invention, however, together with additional objects and advantages will be best understood from the following description and in connection with the accompanying drawings.

BRIEF DESCRIPTION OF THE DRAWINGS

FIG. 3 is still another embodiment of the invention wherein the measuring transformer is configured as a current transformer.

DESCRIPTION OF THE PREFERRED EMBODIMENTS OF THE INVENTION

Figure 1:
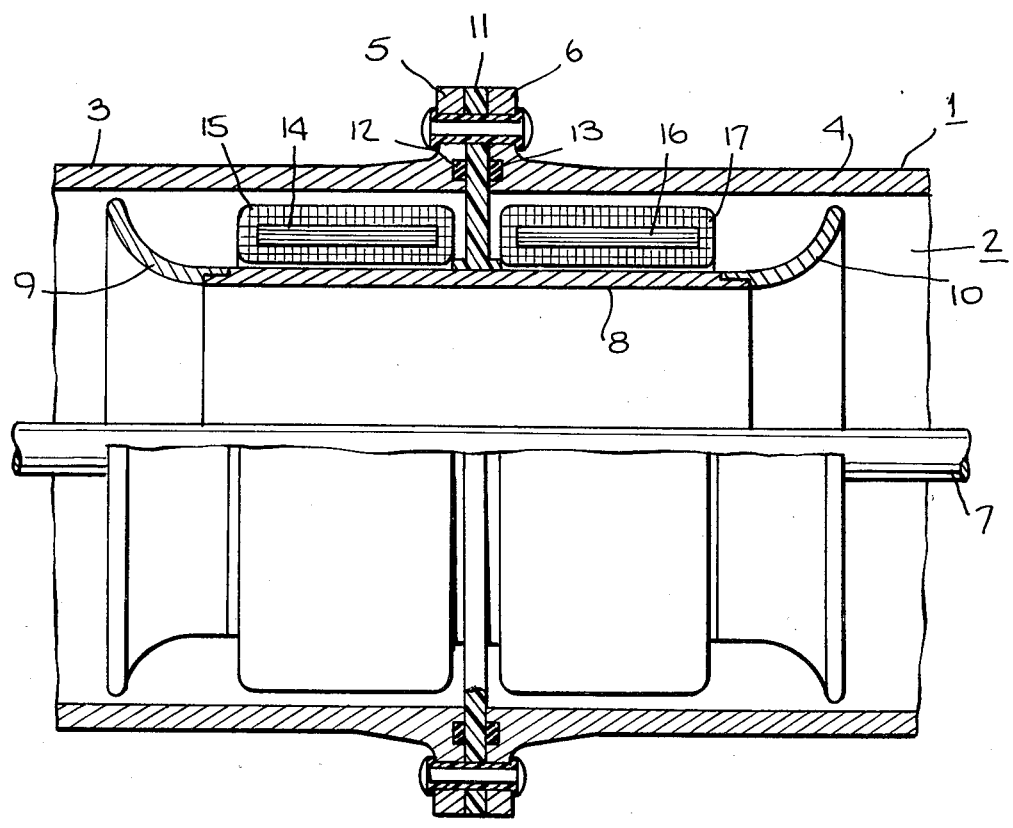
FIG. 1 is a schematic diagram, partially in section, illustrating how the measuring transformer according to the invention is mounted in the metal enclosure of a switching installation. This view illustrates the measuring transformer configured as a combination voltage and current measuring transformer.

In the embodiment shown in FIG. 1, a section of a metal encapsulation 1 of a switching installation 2 is shown; the section of the metal encapsulation 1 consists of an encapsulation part 3 and a further part of the encapsulation 4. Encapsulation parts 3 and 4 carry flanges 5 and 6 respectively at their mutual joint. A high-voltage conductor 7 is disposed inside the metal encapsulation 1.

The high-voltage conductor 7 is surrounded by the metal tube 8 and carries tube parts 9 and 10 at respective ends thereof. The outer tube parts 9 and 10 are cemented to the metal tube 8, where insulating layers are applied at the cement joint for establishing insulation between the tube parts 9 and 10 and the metal tube 8. The tube parts 9 and 10 are guard ring-electrodes. Together with the high-voltage conductor 7, the metal tube 8 forms a high-potential capacitor of a capacitive divider. A low-potential capacitor and an amplifier connected to the low-potential capacitor are, for instance, arranged outside the metal encapsulation 1. The high-potential capacitor and the low-potential capacitor conjointly define the capacitive divider. At the output of the amplifier, a voltage can be taken off which corresponds to the voltage at the high-voltage conductor 7.

At the metal tube 8, a mounting shoulder 11 is attached which consists of insulating material; the mounting shoulder 11 is attached, for instance, by cementing it to the metal tube 8. The mounting shoulder 11 is clamped between the flanges 5 and 6. For sealing the metal encapsulation 1 at the joint of the two encapsulation parts 3 and 4, circular seals 12 and 13 are provided.

In the constricted area formed by the metal tube 8 and the tube parts 9 and 10 are arranged a transformer core unit having a current transformer core 14 with a secondary winding system 15 mounted thereon and a further transformer core unit having a current transformer core 16 with the secondary winding system 17 mounted thereon.

Thus, FIG. 1 shows a combined current and voltage transformer which is held in a simple manner by means of a mounting shoulder 11 attached to the metal tube 8 between the flanges 5 and 6 of the metal encapsulation 1.

Figure 2:
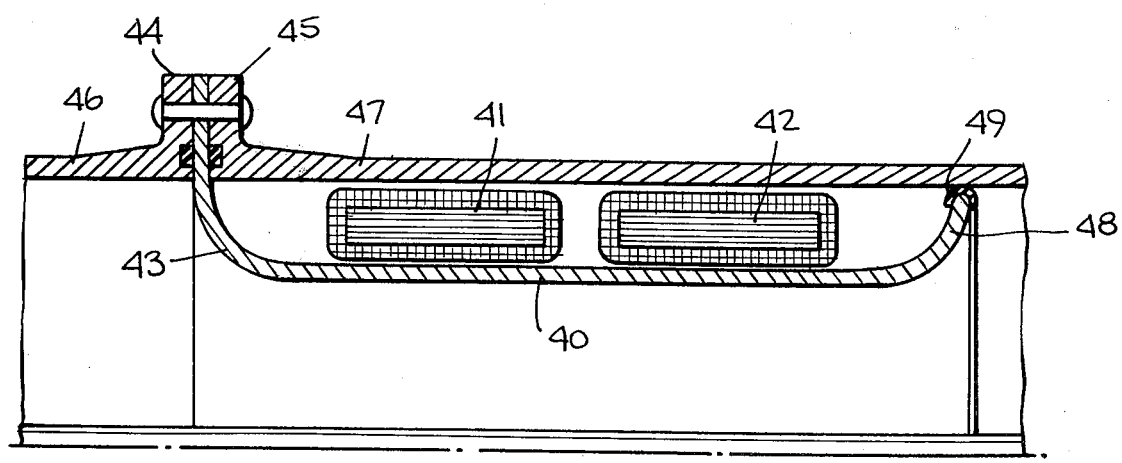
FIG. 2 illustrates the measuring transformer according to the invention configured as a capacitive voltage transformer.
Figure 2:
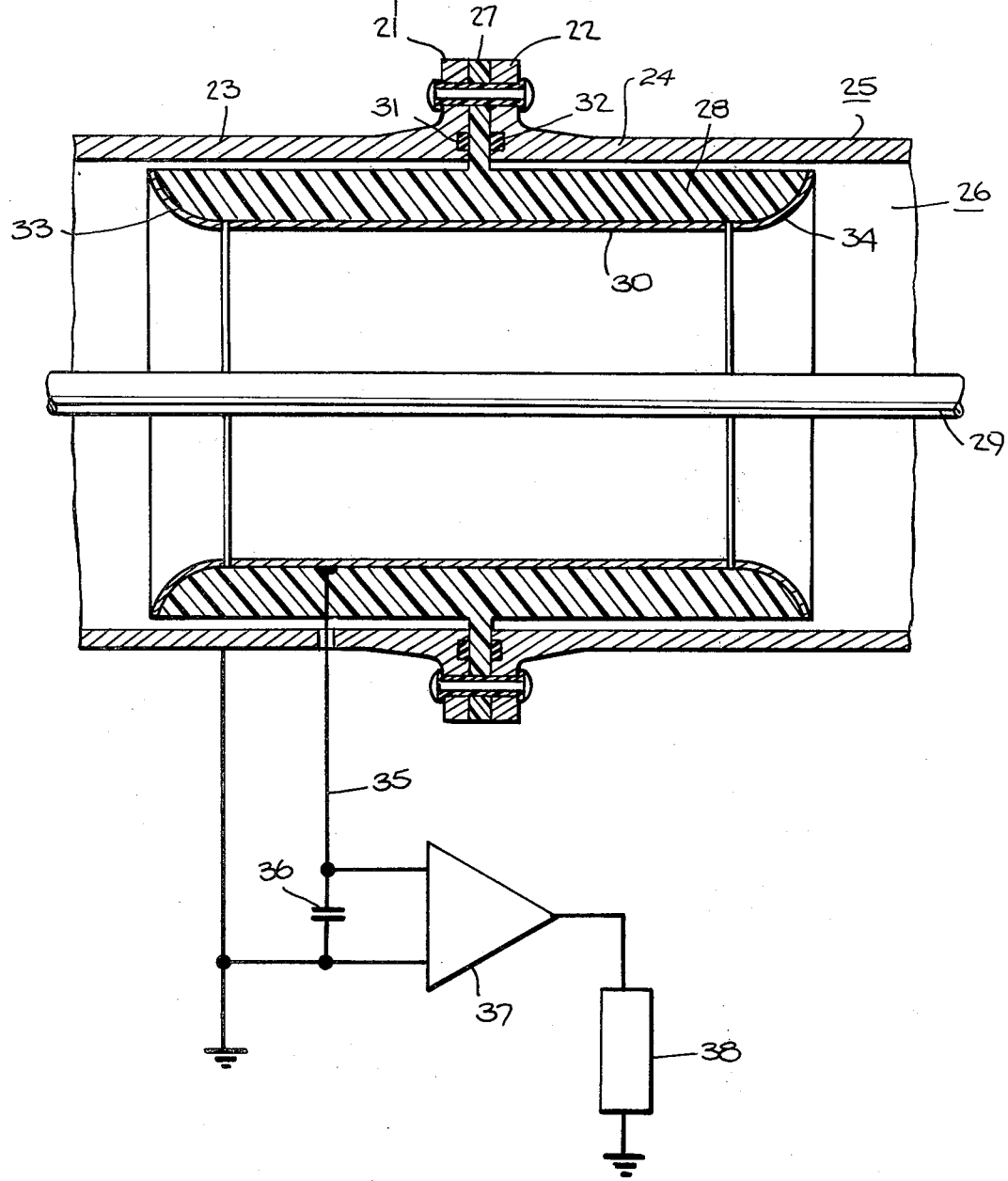

In the embodiment of FIG. 2, a mounting shoulder 27 is again clamped between flanges 21 and 22 of encapsulation parts 23 and 24 of a metal encapsulation 25 of a switching installation 26. This mounting shoulder 27 represents a cast-on, ring-shaped extension of an insulator body 28 which, on its inside surface facing the high-voltage conductor 29, carries an electrode 30 of extended surface area. Two seals 31 and 32 serve to seal the metal encapsulation 25 at the joint between the two encapsulation parts 23 and 24.

The insulator body 28 is rounded at its ends and there carries, insulated from the extended-area electrode 30, further large-area electrodes 33 and 34, which represent guard ring-electrodes. The area electrode 30, together with the high-voltage conductor 29, forms a high-potential capacitor. A capacitive divider is formed by connecting the area electrode 30 to a low-potential capacitor 36 by means of a connecting line 35. The low-potential capacitor 36 is arranged outside the metal encapsulation 25 and is followed by an amplifier 37. A load 38, which can be realized by a measuring instrument or a protective device, is connected to the amplifier 37.

In the current transformer shown in FIG. 3 a metal tube 40 as the carrier for current transformer cores 41 and 42 consists of a single piece whose one expanded end 43 serves as the mounting shoulder and is clamped between the flanges 44 and 45 of the encapsulation parts 46 and 47; the other end 48 of the metal tube 40 is flared out after the current transformer cores 41 and 42 are put in place. The enlarged end 48 is insulated from the encapsulation part 47 by means of an insulating piece 49, in order to avoid a short-circuited turn.

The invention provides a measuring transformer which can be installed in a metal encapsulation with little effort.

What is claimed is:

1. A measuring transformer arrangement for installation and use in a switching installation equipped with a conductor and a metal enclosure having mutually adjacent flanged members surrounding the conductor, the measuring transformer arrangement comprising:
   a rigid, elongated annular member extending in a direction parallel to the conductor and disposed within the switching installation in surrounding relation to the conductor, said annular member having an inner surface spaced from the conductor;
   a transformer assembly carried by said annular member;
   said annular member having a mounting shoulder extending from its outer surface into the interface between the flanges of the flanged members of the metal enclosure; and
   clamping means for clamping said mounting shoulder between the flanges whereby said transformer assembly is held within the metal enclosure in spaced relationship to the conductor.

2. The measuring transformer arrangement of claim 1, said annular member being an insulating body arranged in surrounding relation to the conductor, said mounting shoulder being configured as a ring-shaped shoulder extending from said insulating body.

3. The measuring transformer arrangement of claim 2, said insulating body being formed as a cast body, said mounting shoulder being cast on said body.

4. The measuring transformer arrangement of claim 2, said mounting shoulder being a ring-shaped member embedded in said insulating body.

5. The measuring transformer arrangement of claim 1, said annular member being made up of at least one metal tube arranged in surrounding relation to the conductor, said transformer assembly including current transformer core units being mounted on said tube member.

6. The measuring transformer arrangement of claim 5, said mounting shoulder being a disc connected to said metal tube, said metal tube member and the conductor of the installation conjointly defining a high-potential capacitor; and, a low-potential capacitor connected to said high-potential capacitor, said high-potential capacitor and said low-potential capacitor conjointly defining a capacitive divider.

7. The measuring transformer arrangement of claim 5, said ring-shaped mounting shoulder being a disc-like member made of metal.

8. The measuring transformer arrangement of claim 5, said ring-shaped mounting shoulder being a disc-like member made of plastic material.

9. The measuring transformer arrangement of claim 1, said annular member being a metal tube member, said tube member and the conductor conjointly defining a high-potential capacitor, said mounting shoulder being a support disc connected to said tube member.

10. The measuring transformer arrangement of claim 9, said support disc being made of plastic.

11. The measuring transformer arrangement of claim 9, said support disc being made of metal and containing a ring of insulating material.

12. The measuring transformer arrangement of claim 2, said insulating body and said mounting shoulder being formed as a cast body.

13. The measuring transformer arrangement of claim 6, said support disc being made of plastic.

14. The measuring transformer arrangement of claim 6, said support disc being made of metal and containing a ring of insulating material.

* * * * *